US011470726B2

(12) United States Patent
Aubry

(10) Patent No.: US 11,470,726 B2
(45) Date of Patent: Oct. 11, 2022

(54) CONNECTING ELECTRONIC COMPONENTS TO MOUNTING SUBSTRATES

(71) Applicant: Murata Manufacturing Co., Ltd., Nagaokakyo (JP)

(72) Inventor: Yves Aubry, Fresney le Puceux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/104,367

(22) Filed: Nov. 25, 2020

(65) Prior Publication Data

US 2021/0084772 A1    Mar. 18, 2021

Related U.S. Application Data

(63) Continuation of application No. PCT/IB2019/055499, filed on Jun. 28, 2019.

(30) Foreign Application Priority Data

Jun. 29, 2018 (EP) ..................................... 18305840

(51) Int. Cl.
*H05K 3/32* (2006.01)
*H05K 1/18* (2006.01)

(52) U.S. Cl.
CPC .............. *H05K 3/321* (2013.01); *H05K 1/181* (2013.01); *H05K 2201/10636* (2013.01); *H05K 2201/10992* (2013.01)

(58) Field of Classification Search
CPC ...................................................... H05K 3/321

USPC ......................................................... 174/257
See application file for complete search history.

(56) References Cited

U.S. PATENT DOCUMENTS

| 2004/0229418 | A1* | 11/2004 | Hashimoto | H01L 24/82 |
| | | | | 438/198 |
| 2008/0252194 | A1* | 10/2008 | Kuroiwa | H01J 31/127 |
| | | | | 313/496 |
| 2009/0267220 | A1 | 10/2009 | Kuhlman et al. | |
| 2011/0120518 | A1* | 5/2011 | Rust | H01L 31/0516 |
| | | | | 136/244 |

(Continued)

FOREIGN PATENT DOCUMENTS

| JP | H07312276 | * 11/1995 |
| JP | H07312276 A | 11/1995 |
| JP | H0951020 A | 2/1997 |

OTHER PUBLICATIONS

International Search Report issued for PCT/IB2019/055499, dated Sep. 24, 2019.

(Continued)

*Primary Examiner* — Stanley Tso
(74) *Attorney, Agent, or Firm* — ArentFox Schiff LLP

(57) ABSTRACT

A method of connecting an electronic component on a mounting substrate where the electronic component is arranged with a first surface of the electronic component facing the mounting substrate and an opposite surface of the electronic component is facing away from the mounting substrate. A first component-side conductor on the second surface of the electronic component is electrically connected to a first substrate-side conductor on the mounting substrate by an electrically-conductive adhesive.

6 Claims, 3 Drawing Sheets

(56) References Cited

U.S. PATENT DOCUMENTS

2012/0028433 A1* 2/2012 Naito ................... H01G 9/15
 438/381
2015/0130045 A1* 5/2015 Tseng ................. H01L 23/3737
 257/712
2017/0105278 A1* 4/2017 Cooper ................ H05K 3/321

OTHER PUBLICATIONS

Written Opinion of the International Searching Authority issued for PCT/IB2019/055499, dated Sep. 24, 2019.
EP Office Action issued for EP Application No. 18 305 840.3, dated Dec. 2, 2021.

* cited by examiner

CONNECTING ELECTRONIC COMPONENTS TO MOUNTING SUBSTRATES

CROSS REFERENCE TO RELATED APPLICATIONS

The present application is a continuation of International application No. PCT/IB2019/055499, filed Jun. 28, 2019, which claims priority to European Patent Application No. 18305840.3, filed Jun. 29, 2018, the entire contents of each of which are incorporated herein by reference.

FIELD OF THE INVENTION

The present invention relates to the connecting of electronic components to mounting substrates. More particularly, the invention relates to electronic components mounted on mounting substrates and to methods of connecting electronic components to mounting substrates.

TECHNICAL BACKGROUND

Various technologies have been developed for connecting electronic components to mounting substrates, for example to printed circuit boards (PCBs) and to other mechanical supports. In general, two approaches are used for connecting an electronic component to conductive tracks or pads present on a mounting substrate: either an electric terminal or pad of the electronic component is directly soldered or bump-bonded to a conductive track or pad on the mounting substrate, or an interconnection element such as a wire or ribbon is used to interconnect an electric terminal or pad of the electronic component to a conductive track or pad on the mounting substrate.

Usually soldering or bump bonding is used to connect a conductive pad or track on the mounting substrate to a conductor located on a surface of the electronic component which faces the mounting board, and wire or ribbon bonding is used to connect a conductive pad or track on the mounting substrate to a conductor located on a surface of the electronic component which faces away from the mounting substrate. Bonding wires can have different diameters, usually depending on the current that is to pass through. When currents are high, a ribbon is used. Bonding wires are generally made of gold, aluminum or copper. Ribbons are usually made of aluminum. When the operating frequency of the electronic component is high, a wire bond is preferred. However, a wire bond introduces a parasitic inductance which, at high frequency, can prevent the signal from passing from one part of the circuit to another part of the circuit.

US 2004/0229418 describes a chip component mounted on a circuit board. Interconnects are formed to connect electrodes on a face of the chip remote from the circuit board to external terminals made of solder on the circuit board. The interconnects may be formed by ink-jet spraying of conductive particles dispersed in a dispersant, then processing to solidify the conductive particles. The interconnects may be sprayed over insulating material provided at the side of the chip, in which case, the height of the insulating material is controlled with the aim of reducing the risk that the interconnects passing over the insulating material will break. The interconnects appear to be a source of mechanical weakness in the described structure.

The present invention has been made in the light of the above problems.

SUMMARY OF THE INVENTION

The present invention provides a method of connecting an electronic component on a mounting substrate, comprising: arranging the electronic component on the mounting substrate with a first surface of the electronic component facing the mounting substrate and a second surface of the electronic component facing away from the mounting substrate, the first and second surfaces of the electronic component being opposite to each other; and electrically connecting a first component-side conductor on the second surface of the electronic component to a first substrate-side conductor on the mounting substrate by applying electrically-conductive adhesive in the form of electrically-conductive paste between the first component-side conductor and the first substrate-side conductor, and solidifying the electrically-conductive paste by a heating process.

The use of electrically-conductive adhesive to connect the first component-side conductor to the first substrate-side conductor enables a reduction to be achieved in the parasitic inductance that is observed in the case where the electronic component operates at high frequencies. In particular, useful reductions parasitic inductance may be obtained in the case where the electronic component is configured to operate in an operating frequency range that comprises frequencies higher than 1 GHz. Furthermore, because the electrical connection between the component-side conductor and the substrate-side conductor is achieved using adhesive, the mounting of the component to the mounting substrate is made more robust.

In the above method, a second component-side conductor on the component may be shielded from the electrically-conductive adhesive by applying an electrically-insulating paste to the second component-side conductor before applying the electrically-conductive adhesive.

Application of the electrically-insulating paste before application of the electrically-conductive adhesive makes it possible to avoid undesirable short circuits by a simple technique which does not complicate the manufacturing process.

The first component-side conductor may be electrically connected to conductor portions provided on the mounting substrate at opposite sides of the electronic component, using a common portion of electrically-conductive adhesive. The conductor portions provided on the mounting substrate at opposite sides of the electronic component may be individual conductors or they may be parts of a common conductor. In the case where the conductor portions are parts of a common conductor that surrounds the electronic component on the mounting substrate, the electrically-conductive adhesive may be applied as a roughly dome-shaped bead of paste that covers the electronic component and makes contact with the common conductor on all sides of the electronic component.

In the case where a common portion of electrically-conductive adhesive electrically connects the first component-side conductor to conductor portions on either side of the electronic component, the common portion of electrically-adhesive material spans across the electronic component on the side thereof remote from the mounting substrate and makes an additional contribution to reducing parasitic inductance.

The present invention further provides a device comprising an electronic component mounted on a mounting substrate, the electronic component having a first surface facing the mounting substrate and a second surface facing away from the mounting substrate, the first and second surfaces of the electronic component being opposite to each other, the device comprising: electrically-conductive adhesive electrically connecting a first component-side conductor on the second surface of the electronic component to a first substrate-side conductor on the mounting substrate.

As noted above, because the first component-side conductor is connected to the first substrate-side conductor by the electrically-conductive adhesive a reduction may be achieved in parasitic inductance that is observed in the case where the electronic component operates at high frequencies.

In certain embodiments of the device electrically-insulating paste may be present, shielding a second component-side conductor from the electrically-conductive adhesive. In this manner short-circuits can be avoided by a simple technique.

In certain embodiments of the method and device according to the invention, the electrically-conductive paste may comprise resin and particles of electrically-conductive material, and the electrically-conductive paste may be polymerized and solidified by the heating process. The heating process may involve heating to a temperature in the range from 100° C. to 150° C. As an example, the electrically-conductive particles may include particles of silver.

In the past electrically-conductive paste containing silver has been used in connection with mounting substrates, notably to create or repair conductive tracks provided on a mounting substrate, to interconnect different layers in a multi-layer mounting board and to bond components to substrates which are resistant to soldering. However, unexpectedly, the inventor has discovered that use of electrically-conductive adhesive to interconnect a substrate-side conductor to a component-side conductor which is provided on a surface facing away from the mounting substrate makes it possible to reduce parasitic inductance in the case where the electronic component operates at high frequencies.

Electrically-conducting adhesive may also be applied between the first surface of the component and the facing surface of the mounting substrate. Furthermore, electrically-conductive material may be provided on a rear surface of the mounting substrate remote from the surface on which the electronic component is mounted. In this manner the mounted electronic component is surrounded by electrically-conductive material and parasitic inductance may be further reduced.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the invention do away with wire bonding, or bonding using a ribbon, and instead make use of a conductive adhesive directly placed on the electronic component and spread to the electrical track (or other conductor) on the mounting substrate. This process may be referred to as "glue bonding". In certain embodiments the electrically-conductive adhesive may be applied as a paste and then solidified at a desired temperature. If necessary, a non-conductive paste may be placed on the electronic component beforehand if the component requires it, to avoid short circuits. Of course, if desired an electronic component may be connected to a mounting board using glue bonding as well as one or more other bonding techniques, for example wire bonding, ribbon bonding and soldering (typically, the different bonding techniques are used to establish respective different electrical connections).

A method according to a first embodiment of the invention will now be described with reference to FIGS. 1A to 3.

Figure 1A:
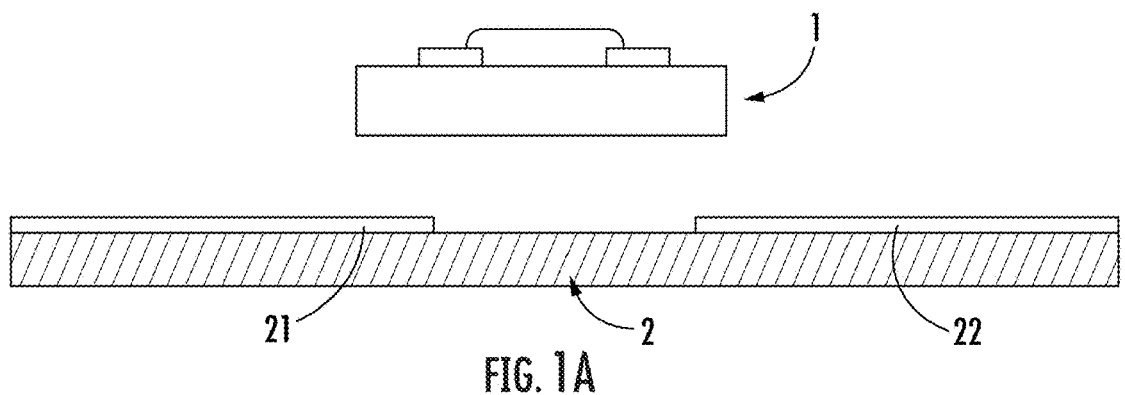
FIGS. 1A to 1D illustrate steps in a method of connecting an electronic component on a mounting substrate, according to an embodiment of the invention.

FIG. 1A illustrates the case of an electronic component 1 which is intended for mounting on a mounting substrate 2. In this example the mounting substrate 2 is a printed circuit board and has two conductors, 21 and 22, on one surface thereof. In this example each of the conductors 21, 22 on the mounting substrate 2 is a respective conductive track. In this example the electronic component 1 is intended to be mounted on the substrate 2 in the orientation illustrated in FIG. 1B, that is, with a first major surface 1a of the electronic component 1 facing towards the mounting substrate 2 and the opposite major surface 1b of the electronic component 2 facing away from the mounting substrate 2. Further, in this example the circuit design requires a first component-side conductor, conductor 10, on the second surface 1b of the electronic component 1 to be electrically connected to track 22 on the mounting substrate 2. In this case track 22 on the mounting substrate 2 is a substrate-side conductor as mentioned in the appended claims.

In this example the electronic component 1 has an electrically-conductive base portion 12 which is intended for electrical connection to electrically-conductive track 21 on the mounting substrate, and there are insulating pads 11 at the sides of the conductor 10. Although not visible in the figures, there is an insulating layer between the base portion 12 of the component 1 and the conductor 10 which is located on the surface 1b of the component.

Figure 1B:
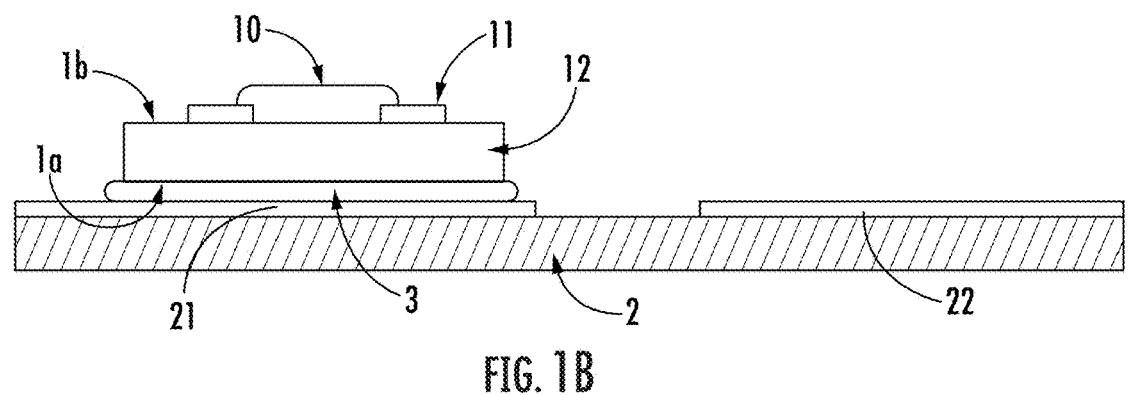

As shown in FIG. 1B, in a first stage of the connecting method according to the present embodiment of the invention the electronic component 1 is placed on the mounting substrate 2 with the surface 1a thereof facing towards the substrate 2. In the example implementation of the embodiment illustrated in FIGS. 1A to 1D, electrically-conductive adhesive 3 is used to stick the underside of the electronic component 1 to electrically-conductive track 21 on the mounting substrate 2, however this is not essential. For instance, if no electrical connection is required (e.g. in a case where base portion 12 is not electrically-conductive) a non-conductive adhesive may be used to bond surface 1a to the substrate 2 and track 21 may be omitted or may be non-conductive. Similarly, other techniques may be used to keep the component 1 in position on the substrate 2 and/or to mechanically connect part or all of the surface 1a of the electronic component 1 to the substrate 2 in a temporary or permanent manner.

An advantage of providing electrically-conductive adhesive 3 between the electronic component 1 and the mounting substrate 2 is that thereby a reduction in parasitic inductance may be obtained.

As a non-limiting example, the electrically-conductive adhesive 3 may be made of a carrier material loaded with conductive material is (e.g. in the form of conductive particles made of silver or other materials). The carrier material may be made from various types of resins, polyimides or epoxys which polymerize at room temperature or between 100° C. and 150° C. For example, the conductive adhesive may be an adhesive from the Epo-Tek® family commercialized by FTPolymer, a conductive adhesive from the Elecolit® family commercialized by Electo-EFD, and so on. In some embodiments, two-part adhesives or UV-cured adhesives may also be used. In respect of the conductive material provided in the adhesive, it is advantageous to use silver in view of the relatively low resistivity thereof. However, other conductive materials (gold, etc.) may be used if desired.

Figure 1C:
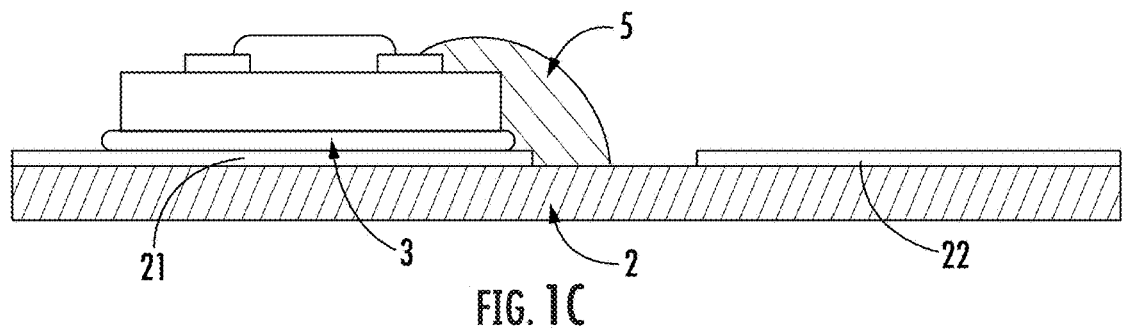

In the example implementation that is illustrated in FIGS. 1A to 1D, part of the electrically-conductive base portion 12 of the component 1 is exposed at a location between the first component-side conductor 10 and the substrate-side conductor 22. So, to avoid a potential short-circuit later on, an electrically-insulating paste 5 is applied to the component 1 to cover the exposed part of the base portion 12, as illustrated in FIG. 1C. The electrically-insulating paste 5 serves to shield the exposed part of the base portion 12 during subsequent processes.

In the example illustrated in FIGS. 1A to 1D the electrically-insulating paste 5 serves to shield the base portion 12 of the component 1 from contact with electrically-conductive paste 6 described below which is subsequently applied. However the electrically-insulating paste 5 may be used in general to shield any component-side conductor, other than first component-side conductor 10, from contact with the electrically-conductive paste 6. In this document the expression "second component-side conductor" encompasses substantially any conductive portion of the component 1 which requires shielding from the electrically-conductive paste 6. Of course, depending on the design of the electronic component 1 to be connected on the mounting substrate 2 there may be no need to provide the electrically-insulating paste 5 and the stage illustrated by FIG. 1C may be omitted.

The electrically-insulating paste 5 may be made of various suitable materials. In a non-limiting example the electrically-insulating paste 5 may be made of the same types of carrier materials as are noted above for the electrically-conductive adhesive 3. An advantage of using electrically-insulating material 5 in the form of a paste is that the paste easily adapts to the contours of the underlying component 1 as the paste is being applied. However, the invention is not limited to the use of electrically-insulating material in the form of a paste for providing shielding from the adhesive 6; other forms of shielding/insulation may be used.

Figure 1D:
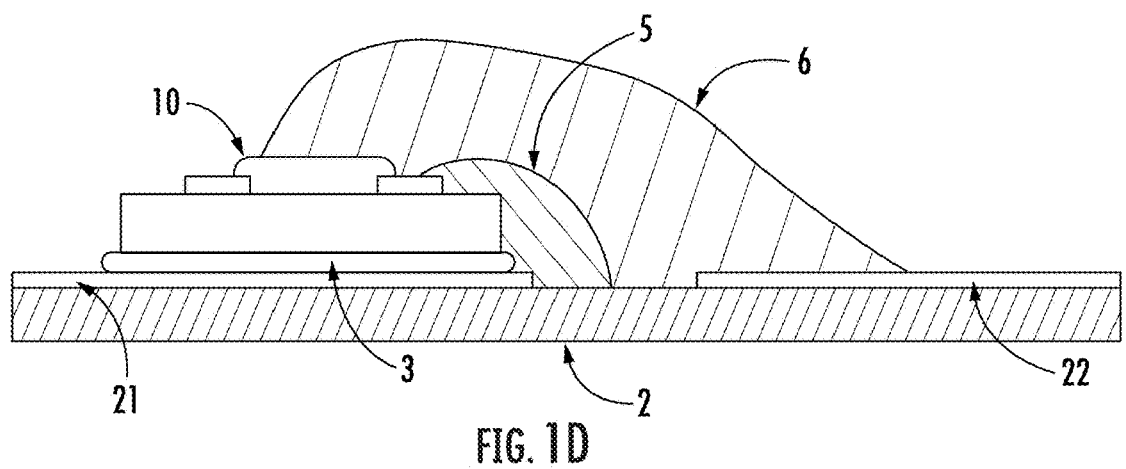

As illustrated in FIG. 1D, an electrically-conductive paste 6 is deposited between the first component-side conductor 10 and the first substrate-side conductor 22 so as to enable an electrical connection (a so-called "glue bond") to be made between the conductors 10 and 22.

The electrically-conductive adhesive 6 is made of a material which has a degree of flexibility at room temperature and can be easily spread from the electronic component 1 to the conductive track 22. Thereafter the electrically-conductive adhesive 6 is subjected to a solidification process to form the glue bond.

For instance, the electrically-conductive adhesive 6 may be a thermosetting polymer material comprising particles of electrically-conducting material, for example it may be a thermo-setting resin containing silver particles. In such a case the electrically-conductive adhesive 6 may be solidified by a heating process, for example heating to a temperature in the range from 100° C. to 150° C. The electrically-conductive adhesive 6 may be made of the same materials as those noted above in relation to the electrically-conductive adhesive 3.

The above-described process for forming a glue bond involves application of a temperature lower than is typically used when electronic components are connected to mounting substrates by soldering—typically tin solder (with or without lead) is solid at room temperature and requires melting at a temperature above 180° C. (227° C. for lead-free tin).

In the case of using electrically-conductive adhesive to achieve the electrical connection between the substrate-side conductor and the component-side conductor located on the surface of the electronic component that faces away from the mounting substrate, the adhesive properties of the connecting material increase the firmness with which the electronic component is mounted to the mounting substrate.

A glue bond according to the invention allows to avoid partially the discontinuity in impedance which normally arises when a wire bond is used to make the top connection (i.e. a connection to a conductor on the side of the component remote from the mounting substrate).

Figure 2:
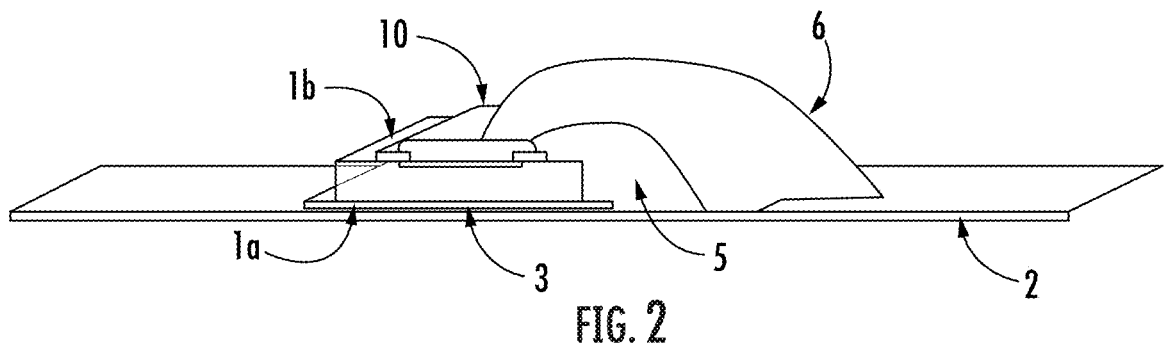
FIG. 2 is a diagram representing a perspective view of an electronic component connected on a mounting substrate following implementation of the method according to FIGS. 1A to 1D.
Figure 3:
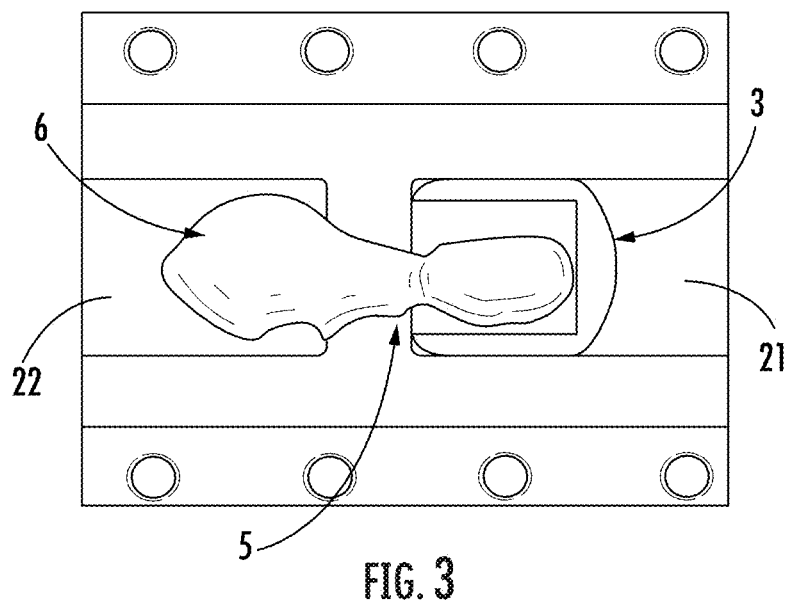
FIG. 3 is a photograph showing a top view of an electrical connection made according to the method of FIGS. 1A to 1D.

FIGS. 2 and 3 illustrate the mounted component 1 after the glue bond has been formed. FIG. 2 is a diagram and FIG. 3 is a photograph showing a top view of a glue bond. In the examples illustrated by FIGS. 1A to 3 the glue bond is formed over the electrically-insulating material 5 and so there is no short-circuit between the conductors 10, 22 and the second component-side conductor (base portion 12 in this example).

Figure 4:
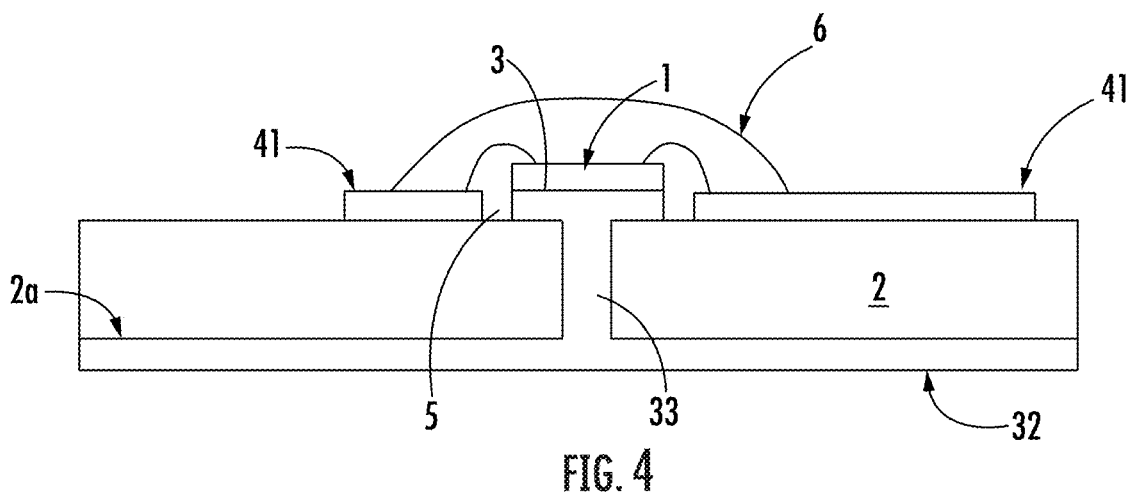
FIG. 4 is a diagram representing a side cross-sectional view through another example of an electronic component connected to a mounting substrate according to an embodiment of the invention.

Another embodiment of the invention is illustrated in FIG. 4. In the example illustrated in FIG. 4 a first component-side conductor (not shown) at the top of the electronic component 1 is connected electrically by a common glue bond 6 to a substrate-side conductor 41 having portions on either side of the electronic component 1. Again in this example, an electrically-insulating material 5 shields other component-side conductors (not shown) from the glue bond.

As illustrated in the example of FIG. 4, in devices according to the invention additional electrically-conductive material may be provided around the electronic component 1 and mounting substrate 2. For instance, electrically-conductive material may be provided at one or more of the following locations: between the first side 1a of the electronic component 1 and the mounting substrate 2 as in the example of FIGS. 1A to 1D (i.e. material indicated at 3 in FIG. 4), on the rear surface 2a of the mounting substrate (i.e. material indicated at 32 in FIG. 4), and in a via or through-hole extending between the major surfaces of the mounting substrate 2 (i.e. material indicated at 33 in FIG. 4). In the case where additional electrically-conductive material is provided in this way, a further reduction in parasitic inductance may be obtained. It will be appreciated that in the configuration illustrated in FIG. 4 the rear side 1a of the electronic component 1 is connected, by the electrically-conductive material 33 in the via, to the conductive material 32 provided on the rear side 2a of the mounting substrate 2.

It has been found that in the case where the electrical connection between a substrate-side conductor and a component-side conductor on the surface of the component remote from the substrate (e.g. conductors 10 and 22 in FIGS. 1A to 1D) is formed using a glue bond according to the invention then there is a significant reduction in parasitic impedance when operating the electronic component 1 at high frequencies. This finding is illustrated in FIG. 5.

Figure 5:
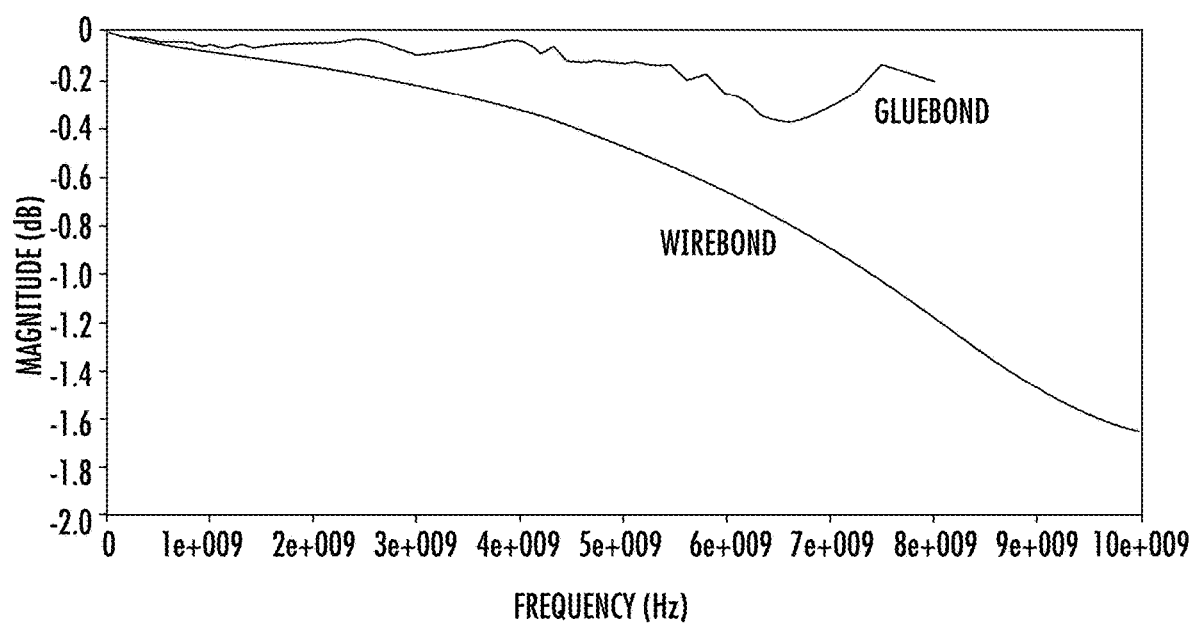
FIG. 5 is a graph showing how the magnitude of an electrical signal through an electronic component varies with operating frequency in a device according to an embodiment of the invention and in a comparative example.

FIG. 5 shows how the transfer function S21 varies in frequency for an electronic component connected on a mounting substrate using a glue bond according to the invention. In this example the mounted electronic component was a capacitor having a footprint of size 250 µm by 250 µm. A second trace in FIG. 5 shows how signal magnitude varies with operating frequency for a comparative example in which another example of the electronic component is connected on the same design of mounting substrate using a bonding wire.

It can be seen form FIG. 5 that, for the comparative example, the signal magnitude deteriorates progressively as the operating frequency increases. In contrast, for the example according to an embodiment of the invention the signal magnitude does not have a clear pattern of decrease with frequency. The improvement in signal magnitude achieved according to the invention becomes noticeable as operating frequency increases beyond 1 GHz and becomes increasingly significant as frequency continues to increase. The improved performance is particularly significant at and above 4 GHz. It is understood that the improved performance is achieved because the use of glue bonding according to the invention enables parasitic inductance to be reduced.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A method of connecting an electronic component on a mounting substrate, the method comprising:
   arranging the electronic component on the mounting substrate with a first surface of the electronic component facing the mounting substrate and a second surface of the electronic component facing away from the mounting substrate, the first and second surfaces of the electronic component being opposite to each other, and the electronic component having a first component-side conductor on the second surface and a second component-side conductor;
   electrically connecting the second component-side conductor of the electronic component to a second substrate-side conductor on the mounting substrate;
   applying an electrically-insulating paste to the second component-side conductor so as to shield the second component-side conductor from the first component-side conductor;
   after applying the electrically-insulating paste, electrically connecting the first component-side conductor on the second surface of the electronic component to a first substrate-side conductor on the mounting substrate by applying electrically-conductive adhesive in the form of electrically-conductive paste between the first component-side conductor and the first substrate-side conductor; and
   solidifying the electrically-conductive paste by a heating process;
   wherein the step of electrically connecting the first component-side conductor comprises using a common portion of the electrically-conductive adhesive, spanning across the electronic component on the side thereof remote from the mounting substrate and across the electrically-insulating paste, to electrically connect the first component-side conductor to the first substrate-side conductor and shield the second component-side conductor from the electrically-conductive paste.

2. The connecting method of claim 1, wherein the electrically-conductive paste comprises resin and particles of electrically-conductive material, and the electrically-conductive paste is polymerized and solidified by the heating process.

3. The connecting method of claim 1, wherein the heating process comprises heating to a temperature in a range from 100° C. to 150° C.

4. The connecting method of claim 1, wherein the electrically-conducting adhesive is provided between the first surface of the electronic component and the mounting substrate.

5. The connecting method of claim 1, wherein the mounting substrate includes an electrically-conductive material on a rear surface thereof, in a continuous sheet facing the electronic component across a whole width thereof, the rear surface being remote from the electronic component.

6. The connecting method of claim 1, wherein a via-hole passes through the mounting substrate and electrically-conductive material is provided in the via-hole.

* * * * *